(12) United States Patent
Yosui

(10) Patent No.: US 10,104,766 B2
(45) Date of Patent: Oct. 16, 2018

(54) RESIN SUBSTRATE AND ELECTRONIC DEVICE

(71) Applicant: Murata Manufacturing Co., Ltd., Nagaokakyo-shi, Kyoto-fu (JP)

(72) Inventor: Kuniaki Yosui, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/652,282

(22) Filed: Jul. 18, 2017

(65) Prior Publication Data

US 2017/0318668 A1    Nov. 2, 2017

Related U.S. Application Data

(63) Continuation of application No. PCT/JP2016/067162, filed on Jun. 9, 2016.

(30) Foreign Application Priority Data

Jun. 25, 2015    (JP) .................................. 2015-127178

(51) Int. Cl.
*H05K 7/10*    (2006.01)
*H05K 7/12*    (2006.01)
(Continued)

(52) U.S. Cl.
CPC ......... *H05K 1/0259* (2013.01); *H05K 1/0373* (2013.01); *H05K 1/115* (2013.01);
(Continued)

(58) Field of Classification Search
CPC .... H05K 1/0259; H05K 1/0373; H05K 1/115; H05K 1/181; H05K 2201/0129;
(Continued)

(56) References Cited

U.S. PATENT DOCUMENTS

| 5,807,509 A * | 9/1998 | Shrier ...................... H01C 7/10 252/512 |
| 7,218,492 B2 * | 5/2007 | Shrier ...................... H01C 7/10 338/20 |

(Continued)

FOREIGN PATENT DOCUMENTS

| JP | 62-291195 A | 12/1987 |
| JP | 5-218663 A | 8/1993 |

(Continued)

OTHER PUBLICATIONS

Official Communication issued in International Patent Application No. PCT/JP2016/067162, dated Aug. 23, 2016.

*Primary Examiner* — Yuriy Semenenko
(74) *Attorney, Agent, or Firm* — Keating & Bennett, LLP

(57) ABSTRACT

A resin substrate includes an insulating base material in which conductive particles are mixed with resin, and conductor patterns provided on the principal surfaces of the insulating base material. When a length at a position at which a distance between two conductor patterns that are adjacent to each other without directly electrically connecting to each other on the same principal surface of the insulating base material is smallest is indicated by L1 and a length at a position at which a distance between two conductor patterns that face each other without directly electrically connecting to each other between the different principal surfaces of insulating base materials is smallest is indicated by L2, L1 is larger than or equal to L2 (L1 ≥L2).

18 Claims, 7 Drawing Sheets

(51) Int. Cl.
*H05K 1/02* (2006.01)
*H05K 1/03* (2006.01)
*H05K 1/11* (2006.01)
*H05K 1/18* (2006.01)
*H05K 3/00* (2006.01)
*H05K 3/30* (2006.01)
*H05K 3/40* (2006.01)
*H05K 3/46* (2006.01)
*H05K 3/02* (2006.01)

(52) U.S. Cl.
CPC .......... *H05K 1/181* (2013.01); *H05K 3/0014* (2013.01); *H05K 3/303* (2013.01); *H05K 3/4038* (2013.01); *H05K 3/4626* (2013.01); *H05K 3/4652* (2013.01); *H05K 3/022* (2013.01); *H05K 2201/0129* (2013.01); *H05K 2201/0195* (2013.01); *H05K 2201/0209* (2013.01); *H05K 2201/0215* (2013.01); *H05K 2201/0323* (2013.01); *H05K 2201/049* (2013.01); *H05K 2201/10522* (2013.01)

(58) Field of Classification Search
CPC ... H05K 2201/0195; H05K 2201/0209; H05K 2201/0323; H05K 2201/10522; H05K 3/0014; H05K 3/303; H05K 3/4038; H05K 3/4652
See application file for complete search history.

(56) References Cited

U.S. PATENT DOCUMENTS

| | | | |
|---|---|---|---|
| 9,320,135 B2* | 4/2016 | Kosowsky | H05K 1/0259 |
| 2003/0133275 A1* | 7/2003 | Miyake | H05K 1/162 |
| | | | 361/761 |
| 2005/0057867 A1* | 3/2005 | Harris | H01C 7/12 |
| | | | 361/56 |
| 2008/0015284 A1* | 1/2008 | Cakmak | B82Y 30/00 |
| | | | 524/1 |
| 2010/0065952 A1* | 3/2010 | Oikawa | H01L 27/1214 |
| | | | 257/679 |

FOREIGN PATENT DOCUMENTS

| | | |
|---|---|---|
| JP | 7-335440 A | 12/1995 |
| JP | 2001-15874 A | 1/2001 |
| JP | 2004-79629 A | 3/2004 |
| JP | 2009-16504 A | 1/2009 |
| JP | 2011-100649 A | 5/2011 |
| JP | 2011100649 * | 5/2011 |
| WO | 2013/105397 A1 | 7/2013 |

* cited by examiner

LONGITUDINAL DIRECTION

RESIN SUBSTRATE AND ELECTRONIC DEVICE

CROSS REFERENCE TO RELATED APPLICATIONS

This application claims the benefit of priority to Japanese Patent Application No. 2015-127178 filed on Jun. 25, 2015 and is a Continuation application of PCT Application No. PCT/JP2016/067162 filed on Jun. 9, 2016. The entire contents of each application are hereby incorporated herein by reference.

BACKGROUND OF THE INVENTION

1. Field of the Invention

The present invention relates to a resin substrate including an insulating base material of which a principal surface includes a plurality of conductor patterns, and also relates to an electronic device including the resin substrate.

2. Description of the Related Art

Conventionally, a resin substrate has been configured by using resin with which metal particles are mixed (see International Publication No. 2013/105397 and Japanese Unexamined Patent Application Publication No. 2011-100649, for example).

A resin substrate disclosed in International Publication No. 2013/105397 is provided with a conductor pattern that configures a coil pattern. In the resin substrate, the coil pattern is configured in a portion of a resin layer in which a magnetic metal particle is mixed. Accordingly, the coil pattern, even if the coil pattern is small in size, has a larger inductance than normal inductance.

A resin substrate disclosed in Japanese Unexamined Patent Application Publication No. 2011-100649 is provided with a structure for ESD (Electro Static Discharge Damage) protection. Specifically, the resin substrate is provided with a cavity portion provided inside the resin substrate, a signal line conductor pattern on the side of a signal line, and a ground line conductor pattern on the side of a ground line, the signal line conductor pattern and the ground line conductor pattern facing each other with a distance in the cavity portion. The resin substrate includes, near the cavity portion, a resin layer in which conductive particles are mixed. The resin substrate, if a surge current flows into the signal line due to electrostatic discharge or the like, generates electric discharge between the signal line conductor pattern and the ground line conductor pattern, in the cavity portion. Accordingly, in the resin substrate, the surge current is able to be released from the signal line to the ground line.

A conventional resin substrate, since charging easily occurs depending on a resin material configuring the resin substrate, has sometimes caused electrostatic discharge damage to an electronic component and an electronic device when the electronic component is mounted on the resin substrate or when the resin substrate is mounted on the electronic device. The configuration disclosed in Japanese Unexamined Patent Application Publication No. 2011-100649, although being capable of releasing a surge current that flows into a signal line to the ground, has had difficulty in preventing charging of the resin substrate itself.

Therefore, in order to make a resin substrate difficult to be charged, a substantial electrical resistivity may be reduced while insulation in the resin substrate is maintained. Specifically, like conventional techniques, conductive particles may be mixed with resin. However, mere mixing of conductive particles and resin may increase the occurrence rate of a failure of a short circuit between conductor patterns mainly due to occasional deformation of the conductive particles, in a process of manufacturing a resin substrate.

SUMMARY OF THE INVENTION

In view of the foregoing, preferred embodiments of the present invention provide a resin substrate that is difficult to be charged and is able to significantly reduce or prevent a failure such as a short circuit between conductor patterns, and an electronic device including the resin substrate.

A resin substrate according to a preferred embodiment of the present invention includes: an insulating base material including a pair of principal surfaces facing each other in a direction perpendicular to the principal surfaces of the resin substrate (hereinafter referred to as "substrate thickness direction"); a plurality of conductor patterns provided on the principal surfaces of the insulating base material, and the insulating base material includes a primary insulating base material in which a plurality of conductive particles are mixed with resin; the plurality of conductor patterns include at least two conductor patterns that are adjacent to each other without directly electrically connecting to each other on the same principal surface of the primary insulating base material; the plurality of conductor patterns include at least two conductor patterns that face each other without directly electrically connecting to each other between the different principal surfaces of primary insulating base materials; and a length at a position at which a distance between the two conductor patterns that are adjacent to each other without directly electrically connecting to each other on the same principal surface of the primary insulating base material is smallest is larger than or equal to a length at a position at which a distance between the two conductor patterns that face each other without directly electrically connecting to each other between the different principal surfaces of the primary insulating base materials is smallest. In particular, the length at a position at which a distance between the two conductor patterns that are adjacent to each other without directly electrically connecting to each other on the same principal surface of the primary insulating base material is smallest may preferably be larger than the length at a position at which a distance between the two conductor patterns that face each other without directly electrically connecting to each other between the different principal surfaces of the primary insulating base materials is smallest.

In these configurations, conductive particles are able to reduce a substantial electrical resistivity of an insulating base material and also to make a substrate portion difficult to be charged. However, if a plurality of conductive particles are mixed in an insulating base material, the longitudinal direction of the conductive particles is easily oriented in a direction parallel to the principal surface of the insulating base material (hereinafter referred to as "principal surface parallel direction"). Therefore, the conductive particles easily cause a short circuit between conductor patterns that are adjacent to each other on the same principal surface of an insulating base material. In contrast, with the above configuration, the minimum distance between the conductor patterns that are adjacent to each other on the same principal surface of the insulating base material is increased, so that the occurrence of a failure such as a short circuit between the conductor patterns by the conductive particles is able to be significantly reduced or prevented.

The plurality of conductive particles may preferably include a conductive particle that extends in a longitudinal direction. In addition, the conductive particle may preferably include carbon.

Since a plurality of conductive particles include conductive particles of such a shape, the longitudinal direction of the conductive particles is easily oriented in the principal surface parallel direction of an insulating base material, which enables various preferred embodiments of the present invention to be particularly effective and advantageous in this respect.

Carbon is an example of a concrete material of such conductive particles. In addition, carbon, since having an electrical resistivity lower than the electrical resistivity of a common resin material, is suitable as a material to be mixed with resin in order to reduce the substantial electrical resistivity of a resin substrate while maintaining the insulation of the resin substrate. Moreover, carbon has a high chemical stability and, also in this respect, is suitable as a material to be mixed with resin.

The insulating base material may preferably include a plurality of insulating base materials that are stacked on one another. In such a case, the plurality of insulating base materials may preferably include thermoplastic resin. In this configuration, the plurality of insulating base materials are able to be integrated through thermal pressing.

The resin substrate may preferably include a first electronic component that is incorporated in or mounted on the insulating base material.

In this configuration, occurrence of the electrostatic discharge damage in the first electronic component due to charging of the insulating base material is able to be significantly reduced or prevented, and a resin substrate is able to be manufactured with a high manufacturing yield.

An electronic device according to a preferred embodiment of the present invention may preferably include: the resin substrate; a structure that is provided with the resin substrate; and a second electronic component that is provided in the structure and electrically connected to the resin substrate.

In this configuration, occurrence of the electrostatic discharge damage in the second electronic component due to charging of the resin substrate is able to be significantly reduced or prevented, and an electronic device is able to be manufactured with a high manufacturing yield.

According to various preferred embodiments of the present invention, the mixing of conductive particles and resin is able to reduce a substantial electrical resistivity of an insulating base material and make a resin substrate difficult to be charged. In addition, the distance between the conductor patterns that are adjacent to each other on the same principal surface of the primary insulating base material in which conductive particles are mixed with resin is increased, so that the occurrence of a failure such that a short circuit between the conductor patterns may occur by the conductive particles that are mixed in the primary insulating base material is able to be significantly reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
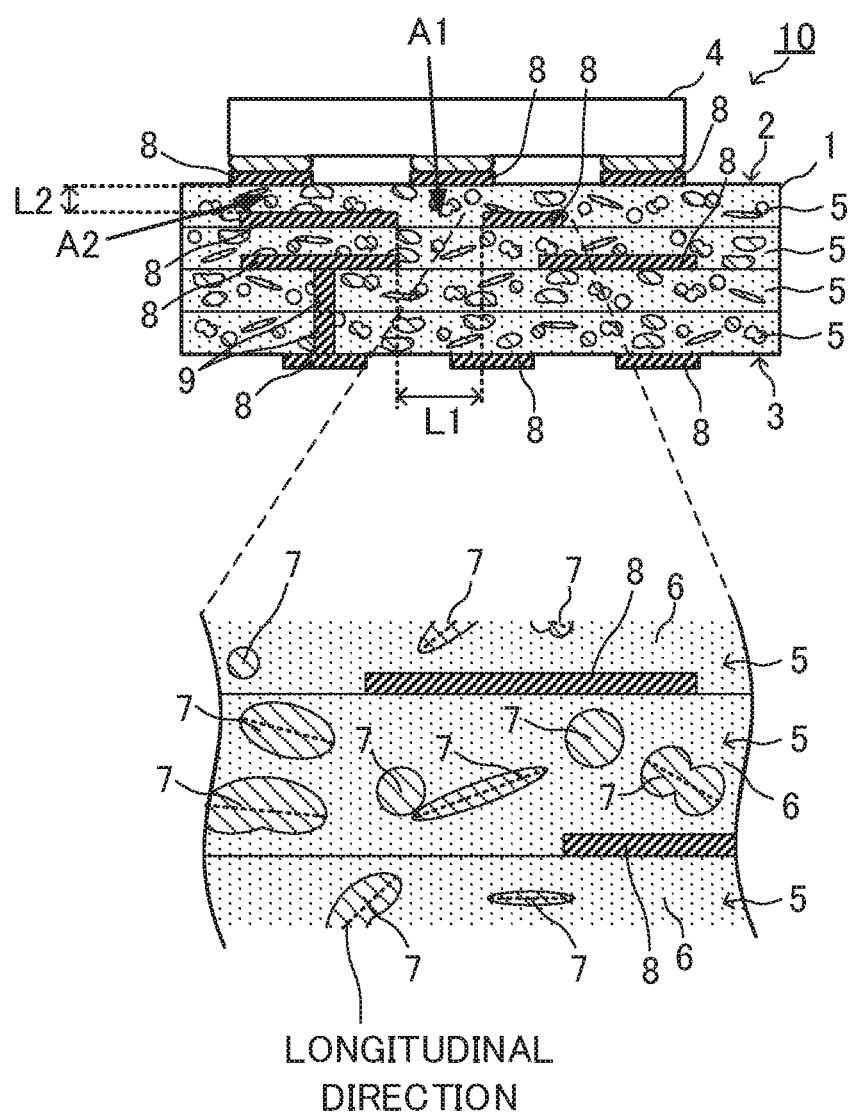
FIG. 1 is a cross-sectional view with a partially enlarged cross-sectional view of a resin substrate according to a first preferred embodiment of the present invention.

Hereinafter, a description will be made of a resin substrate 10 according to a first preferred embodiment of the present invention. FIG. 1 is a cross-sectional view with a partially enlarged cross-sectional view, viewed from the lateral side of the resin substrate 10.

The resin substrate 10 is provided with a substrate portion 1 and an electronic component (first electronic component) 4. The substrate portion 1 includes an upper principal surface 2 and a lower principal surface 3. The upper principal surface 2 is a component mounting surface. The lower principal surface 3 is an external mounting surface of the resin substrate 10. The electronic component 4 is surface-mounted on the upper principal surface 2 of the substrate portion 1. It is to be noted that the electronic component 4 may be mounted in the substrate portion 1 while being entirely or partially embedded (internally built) in the substrate portion 1. The electronic component 4 may not be provided.

The substrate portion 1 is provided with at least one layer of an insulating base material 5 having a flat film shape. The insulating base material 5 is provided with at least one insulating base material 5 provided with resin 6 and a plurality of conductive particles 7 that are mixed with the resin 6. Such an insulating base material 5 is equivalent to the "primary insulating base material". In the first preferred embodiment, the substrate portion 1 preferably includes a total of four layers of insulating base materials 5, and all the four layers of the insulating base materials 5 are each equivalent to the primary insulating base material, for example.

A conductive particle 7 has an electrical resistivity lower than the specific electrical resistivity of the resin 6. A plurality of such conductive particles 7 are dispersed in the resin 6, so that the substantial electrical resistivity of each of the insulating base materials 5 becomes lower than the specific electrical resistivity of the resin 6. Accordingly, the substrate portion 1 is more difficult to be charged than a substrate portion including the insulating base materials 5 each of which does not include the conductive particles 7 but only includes the resin 6.

Figure 2:
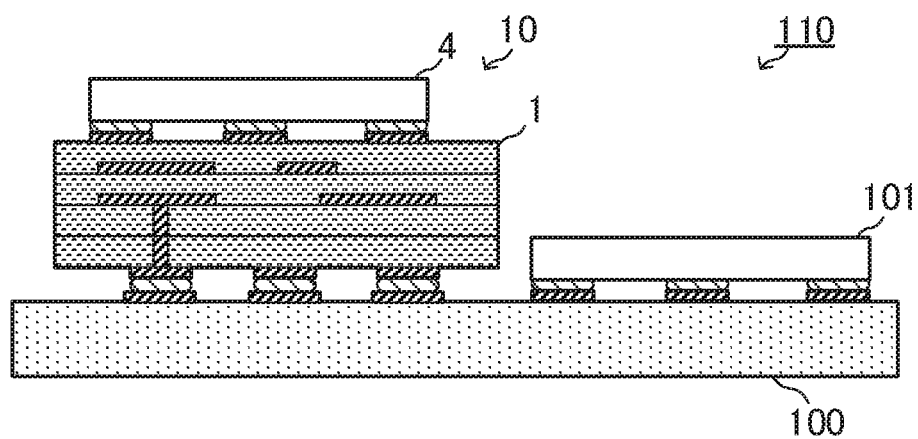
FIG. 2 is a cross-sectional view of an electronic device according to the first preferred embodiment of the present invention.

FIG. 2 is a cross-sectional view of an electronic device 110, the electronic device 110 being configured by mounting a resin substrate 10 on an external substrate 100. When the resin substrate 10 is mounted on a structure such as the external substrate 100, if the amount of charging of the substrate portion 1 is large, a surge current flows into an electronic component (second electronic component) 101 that is provided on the external substrate 100 and is electrically connected to the resin substrate 10, which may cause electrostatic discharge damage. However, the substrate portion 1, since including the conductive particles 7 and having a low electrical resistivity, is difficult to be charged. Therefore, when such an electronic device 110 is manufactured, electrostatic discharge damage is able to be significantly reduced or prevented from occurring due to a surge current flowing from the resin substrate 10 into the electronic component 101 through the external substrate 100. In other words, the electronic device 110 is able to significantly reduce or prevent the occurrence of electrostatic discharge damage in the electronic component 101 due to charging of the resin substrate 10, and is able to be manufactured with a high manufacturing yield.

In addition, as illustrated in FIG. 1, the substrate portion 1 is provided with a plurality of conductor patterns 8 and a via conductor 9. The plurality of conductor patterns 8 are separated from each other, and are provided on the principal surface of each of the insulating base materials 5. The via conductor 9 directly electrically connects a pair of conductor patterns 8, among the plurality of conductor patterns 8, the pair of conductor patterns 8 being provided on different principal surfaces of insulating base materials 5 and facing each other in the substrate thickness direction.

In the first preferred embodiment of the present invention, the plurality of conductor patterns 8 include a pair of conductor patterns 8 that are adjacent to each other in the principal surface parallel direction without directly electrically connecting to each other, on the same principal surface of one of the insulating base materials 5 that are equivalent to the primary insulating base materials. In addition, the plurality of conductor patterns 8 include a pair of conductor patterns 8 that face each other in the substrate thickness direction without directly electrically connecting to each other, between the different principal surfaces of the insulating base materials 5 that are equivalent to the primary insulating base materials. Hereinafter, a position at which a distance between the pair of conductor patterns 8 that are adjacent to each other in the principal surface parallel direction without directly electrically connecting to each other is smallest is indicated by A1, and a length of the distance at the position A1 is indicated by L1. In addition, a position at which a distance between the pair of conductor patterns 8 that face each other in the substrate thickness direction without directly electrically connecting to each other is smallest is indicated by A2, and a length of the distance at the position A2 is indicated by L2. In the substrate portion 1, the length L1 at the position A1 is made larger than the length L2 at the position A2.

As illustrated in partially enlarged FIG. 1, the plurality of conductive particles 7 include a conductive particle that extends in a longitudinal direction indicated by the dashed line in FIG. 1. The plurality of conductive particles 7, while depending on the quality of material or a method of manufacturing a particle, include conductive particles with various shapes such as a circular shape, a columnar shape, a needle shape, a foil shape, and a collected shape of such shapes, in the insulating base material 5.

However, the plurality of conductive particles 7 has a tendency such that the longitudinal direction is easily oriented along the principal surface parallel direction of the insulating base material 5. For example, among the plurality of conductive particles 7, the number of conductive particles 7 of which the longitudinal direction is oriented at an angle closer to the principal surface direction of the insulating base material 5 than to the substrate thickness direction is likely to be larger than the number of conductive particles 7 of which the longitudinal direction is oriented at an angle closer to the substrate thickness direction than to the principal surface parallel direction. The factor that causes such a tendency lies in a manufacturing method of the resin substrate 10 as described below.

Figure 3:
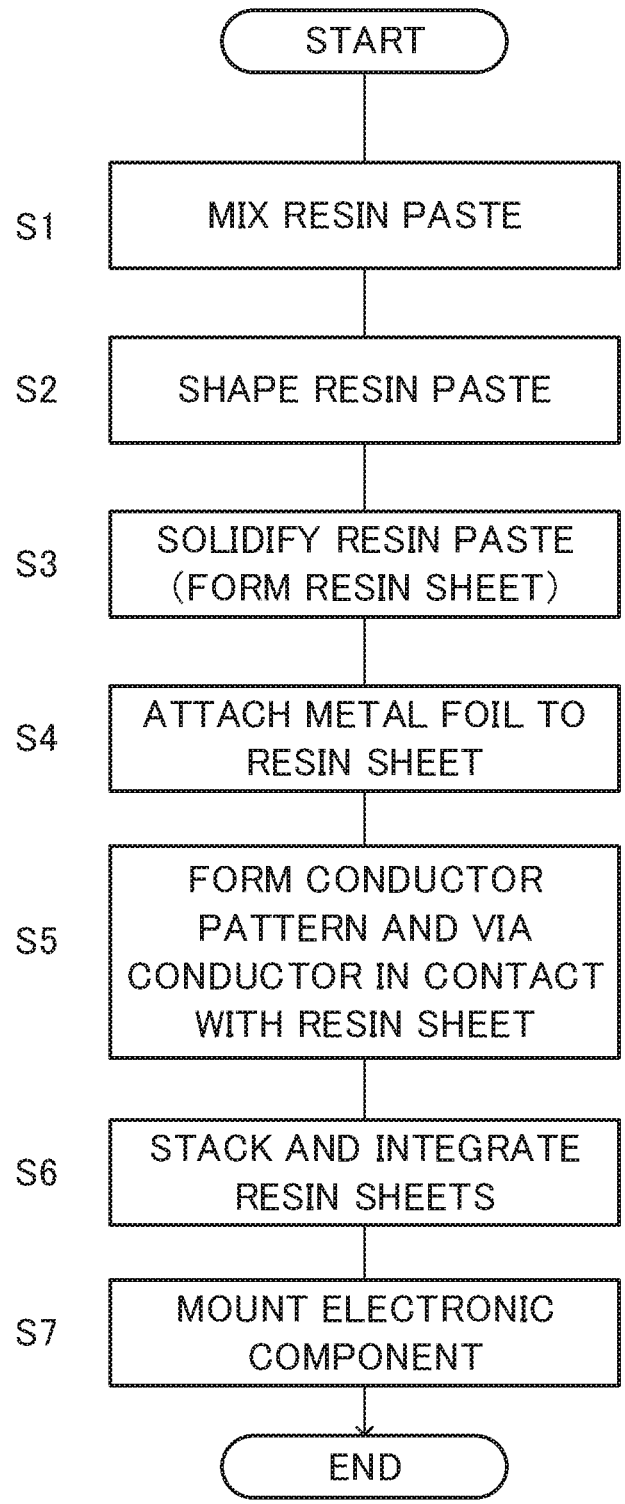
FIG. 3 is a flow chart that exemplifies a manufacturing method of the resin substrate according to the first preferred embodiment of the present invention.
Figure 4:
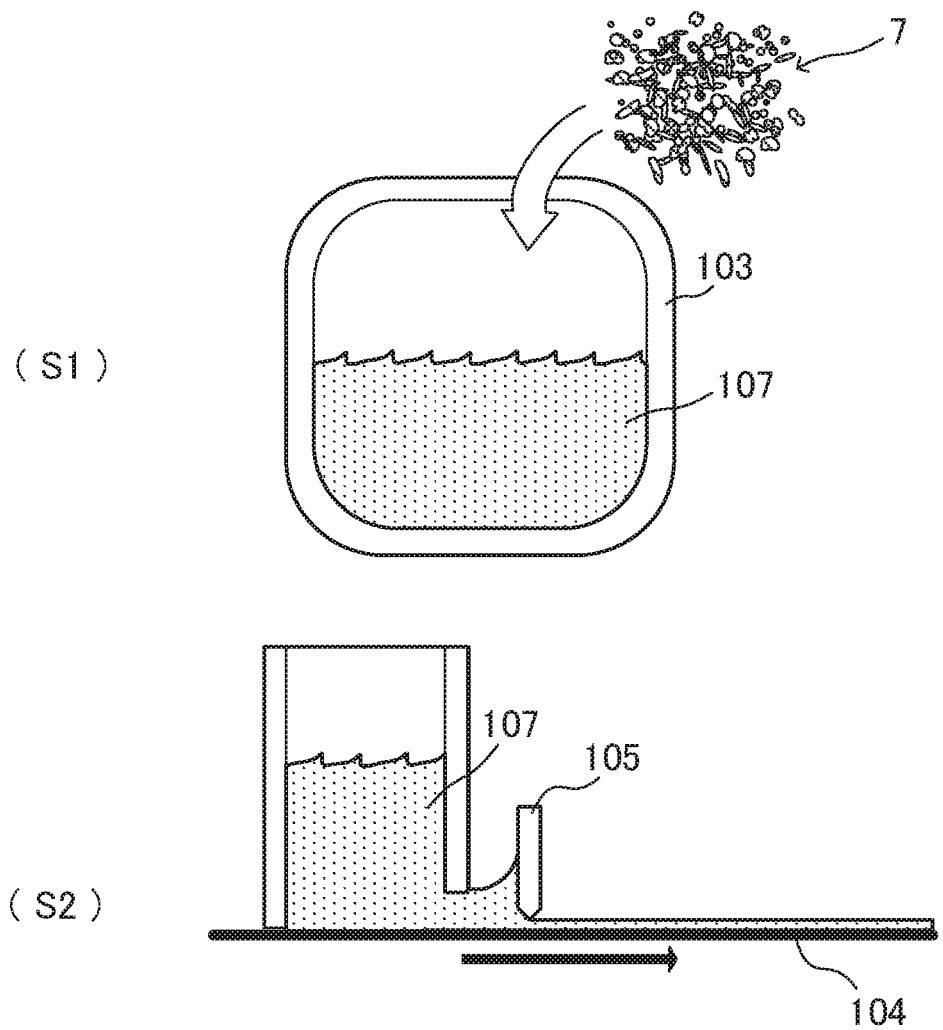
FIG. 4 schematically shows a process of manufacturing the resin substrate according to the first preferred embodiment of the present invention.
Figure 5:
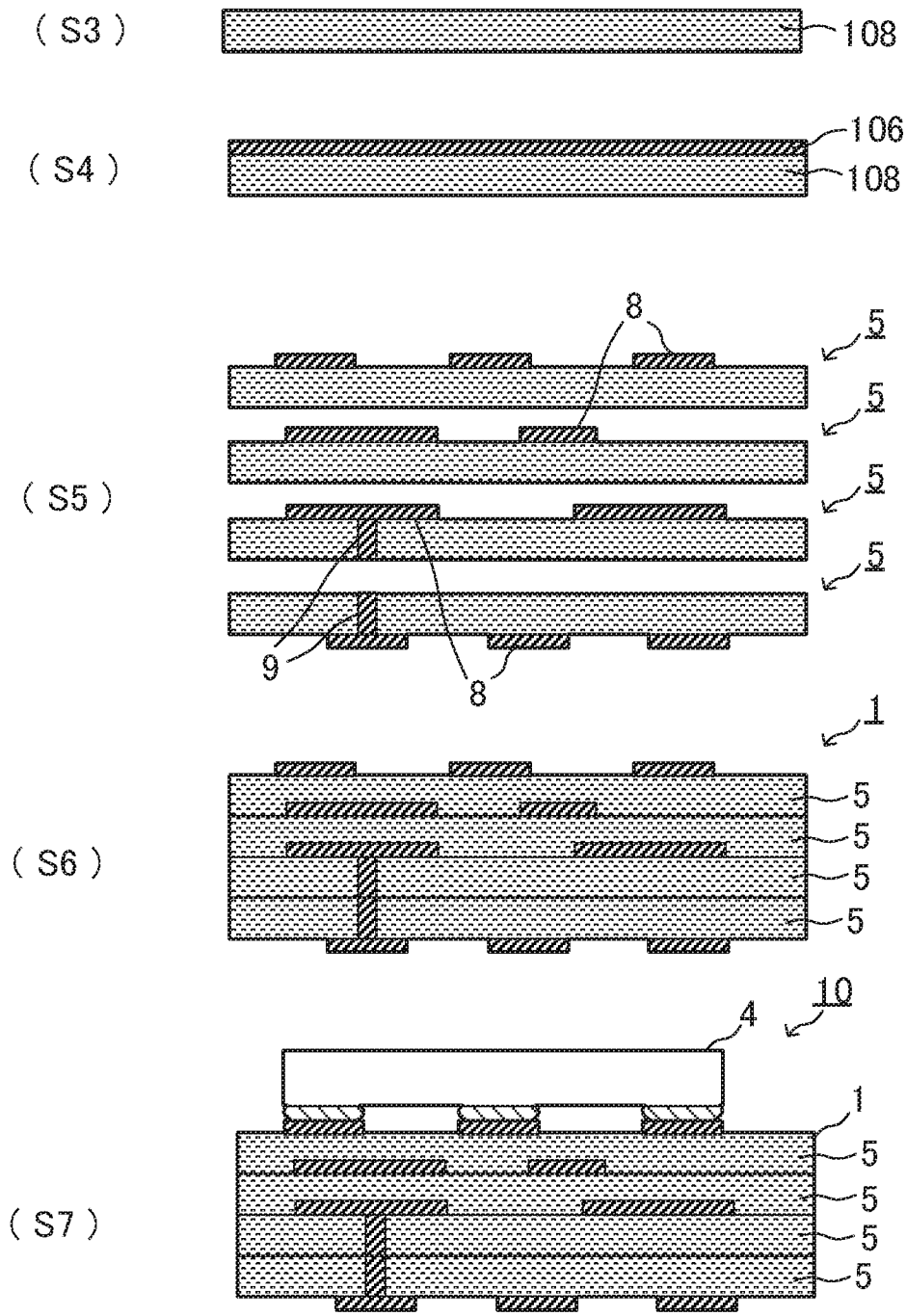
FIG. 5 is a cross-section view showing a state in the process of manufacturing the resin substrate according to the first preferred embodiment of the present invention.

FIG. 3 is a flow chart that exemplifies a method of manufacturing the resin substrate 10. FIG. 4 schematically shows a portion of the process of manufacturing the resin substrate 10. FIG. 5 is a cross-sectional view showing a state in the process of manufacturing the resin substrate 10.

It is to be noted that, while the following will describe a case in which a conductor pattern 8 is formed by a subtractive process, a publicly known semi-additive process, that is, a process of forming a metal film on a resist and then shaping a conductor pattern by removing the resist, is also able to be used. In addition, while the following will describe only a portion to be a single resin substrate 10, a plurality of resin substrates 10, in practice, may be manufactured at one time in such a manner that the plurality of resin substrates 10 are arranged vertically and horizontally in the principal surface parallel direction in a large original sheet and are then cut out from the original sheet. Moreover, the following will also describe a case in which resin 6 is made of thermoplastic resin, as an example.

In the manufacturing method of a resin substrate 10 using the subtractive process, to begin with, conductive particles 7 together with resin paste 107 to be resin 6 are put in a stirring tank 103, and the resin paste 107 and the conductive particles 7 are mixed in the stirring tank 103 (see S1 in FIG. 3 and FIG. 4). The conductive particles 7 are put in the stirring tank 103 after a ratio of weight of the conductive particles 7 is adjusted so that the electrical resistivity of the insulating base material 5 may be about 1 MΩ·cm later. It is to be noted that the resin 6 is able to be made of any resin material, for example, liquid crystal polymer resin, PEEK (polyetheretherketone), PEI (polyetherimide), PPS (polyphenylene sulfide), or PI (polyimide). For example, the liquid crystal polymer resin has flexibility, thermoplasticity, and the like, and, if a resin substrate 10 is configured using the liquid crystal polymer resin, the resin substrate 10 is able to have adequate insulation and flexibility. The resin paste 107 may be powdery resin 6 mixed with binder or may be molten resin 6 with thermoplasticity. In addition, the conductive particles 7 are able to be made of any conductive material, for example, an iron-based material such as permalloy and ferrite, pure iron, and carbon. Of such conductive materials, carbon of which the chemical stability is high and of which the electrical resistivity is hardly changed due to oxidization or reduction may be particularly preferably used.

Subsequently, the resin paste 107 is shaped into a sheet (see S2 in FIG. 3 and FIG. 4). For example, the resin paste 107 is applied on a carrier film 104 and then the resin paste 107 together with the carrier film 104 is pulled under a doctor blade 105 so as to shape the resin paste 107 in a constant thickness.

Then, the resin paste 107 that has been shaped with a constant thickness is subjected to heat treatment or the like so as to solidify the resin paste 107 and form a resin sheet 108 (see S3 in FIG. 3 and FIG. 5).

In the process (step S2) of forming the resin sheet 108 as described above, a flow that may spread in the principal surface parallel direction is generated in the resin paste 107 by the external force added from the doctor blade 105 or the like to the resin paste 107 or the self-weight of the resin paste 107. Such a flow causes the conductive particles 7 inside the resin sheet 108 to likely have an orientation such that the principal surface parallel direction may be the longitudinal direction.

Then, a metal foil 106 to be the conductor pattern 8 later is attached on both sides or one side of the resin sheet 108 mainly by thermal pressing, which form the resin sheet 108 on which the metal foil 106 has been attached (see S4 in FIG. 3 and FIG. 5). It is to be noted that the metal foil 106 is also able to be attached on one side of the resin sheet 108 by previously attaching the metal foil 106 on the carrier film 104.

Subsequently, a conductor pattern 8 and a via conductor 9 are formed in contact with the resin sheet 108, and an insulating base material 5 is formed from the resin sheet 108 (see S5 in FIG. 3 and FIG. 5). For example, in using the subtractive process, the metal foil 106 is masked with an etching resist. Subsequently, the metal foil 106 exposed from the etching resist is removed by etching. Then, the etching resist is washed away. In such a manner, the conductor pattern 8 is able to be shaped.

In addition, a through hole may be formed in the resin sheet 108, and electroless plating is applied to the inner wall of the through hole or conductive paste is filled in the through hole to metallize the conductive paste, which is thus able to form a via conductor 9.

Subsequently, the insulating base material 5 that has been formed as described above is prepared in plural, and a plurality of insulating base materials 5 are stacked on one another in a state of being positioned. Then, the plurality of insulating base materials 5 are thermally pressed in the substrate thickness direction so as to be closely contacted to each insulating base material 5 made of thermoplastic resin, which thus forms a substrate portion 1 in which the plurality of insulating base materials 5 are integrated (see S6 in FIG. 3 and FIG. 5).

It is to be noted that the via conductor 9 may be metallized by thermal pressing in this process. In such a case, the via conductor 9 is able to be directly joined to the conductor patterns 8 provided on the principal surfaces of different insulating base materials 5, so that the reliability and robustness of connection between the via conductor 9 and the conductor pattern 8 are able to be enhanced.

Through the above various kinds of processes, the insulating base material 5 is deformed to be extended in the principal surface parallel direction due to a force such as the tension force acting on the carrier film 104 or the external force added through the doctor blade 105, the metal foil 106, and other insulating base materials 5. This also causes the conductive particles 7 in the insulating base material 5 to likely have an orientation such that the longitudinal direction may be the principal surface parallel direction.

Subsequently, the electronic component 4 is surface-mounted on the substrate portion 1 (see S7 in FIG. 3 and FIG. 5). For example, while the electronic component 4 is mounted on the substrate portion 1, a terminal electrode of the electronic component 4 may be soldered to the conductor pattern 8 using the reflow method or the like. Alternatively, the terminal electrode of the electronic component 4 may be joined to the conductor pattern 8 mainly through a bump using the ultrasonic joining method or the like. Alternatively, before the electronic component 4 is mounted, a resist film that covers the principal surface of the substrate portion 1 may be formed while the conductor pattern 8 is exposed.

In the process (step S7), if the amount of charging of the substrate portion 1 is large, a surge current flows into the electronic component 4 that is provided on the substrate portion 1, which may cause electrostatic discharge damage on the electronic component 4. However, in the first preferred embodiment, the substrate portion 1, since including the conductive particles 7 and having a low electrical resistivity, is difficult to be charged, which significantly reduces or prevents the electrostatic discharge damage on the electronic component 4 from occurring.

Through the above manufacturing method, a resin substrate 10 is able to be manufactured. Since such a manufacturing method is preferably used, on the insulating base material 5 (resin sheet) having a flat film shape, an action such that the longitudinal direction of the conductive particles 7 inside the insulating base material 5 may be oriented to the principal surface parallel direction of the insulating base material 5 works, in the various kinds of processes.

Therefore, if no measures are taken, a short circuit between the conductor patterns 8 that are adjacent to each other in the principal surface parallel direction of the insulating base material 5 is likely to occur through the conductive particles 7. Thus, in the resin substrate 10, as described with reference to FIG. 1, the length L1 at the position A1 at which a distance between two conductor patterns 8 that are adjacent to each other on the same principal surface of the insulating base material 5 that is equivalent to the primary insulating base material without directly electrically connecting to each other is smallest is made larger than the length L2 at the position A2 at which a distance between two conductor patterns 8 that face each other between the different principal surfaces of the insulating base materials 5 that are equivalent to the primary insulating base materials without directly electrically connecting to each other is smallest. Accordingly, in the insulating base material 5 that is equivalent to the primary insulating base material, a short circuit between the conductor patterns 8 that are adjacent to each other in the principal surface parallel direction through the conductive particles 7 is able to be significantly reduced or prevented. Therefore, the resin substrate 10 is able to significantly reduce or prevent the occurrence of a failure such as a short circuit between the conductor patterns 8, and is able to be manufactured with a high manufacturing yield.

It is to be noted that the above manufacturing method is merely an example, and a resin substrate 10 is able to be manufactured even by other manufacturing methods. Even by any manufacturing method, the process of forming a resin sheet into the shape of a flat film and the process of stacking additional insulating base materials in the substrate thickness direction of the insulating base material are required, so that the conductive particles are unable to avoid a tendency such that the longitudinal direction is oriented in the principal surface parallel direction in the insulating base material. Therefore, even if the resin substrate 10 is manufactured by any manufacturing method, as described above, the configuration in which the length between the conductor patterns is set is effective in significantly reducing or preventing a short circuit between the conductor patterns.

In addition, in the first preferred embodiment, while the configuration in which the four layers of the primary insulating base materials are stacked as the resin substrate 10 is disclosed, resin substrates according to various preferred embodiments of the present invention are not limited to such a configuration, and are also able to be configured as a multilayer substrate of which the number of layers is different from four layers or as a single layer substrate. Moreover, other than the method of mixing the conductive particles in all the insulating base materials, a method of mixing the conductive particles in only some of the insulating base materials may be included. In such a case, the length between the above conductor patterns may be set only in the insulating base material in which the conductive particles are mixed.

Subsequently, a description will be made of a resin substrate 10A according to a second preferred embodiment of the present invention. The second preferred embodiment discloses a case in which a substrate portion is defined by a single layer of an insulating base material.

Figure 6:
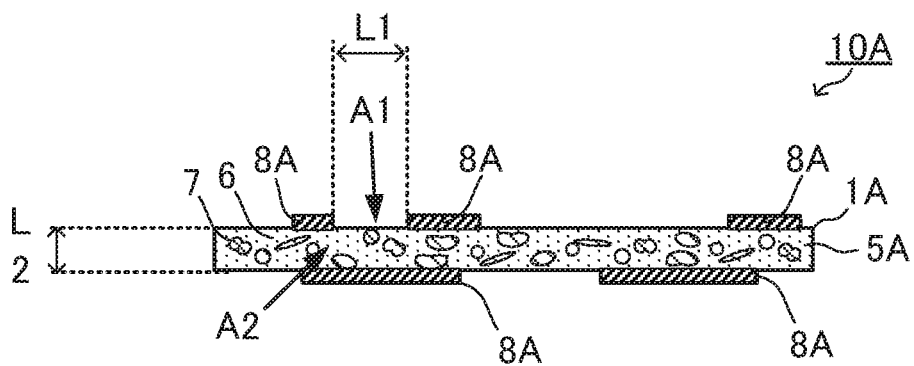
FIG. 6 is a cross-sectional view of a resin substrate according to a second preferred embodiment of the present invention.

FIG. 6 is a schematic cross sectional view of the resin substrate 10A.

The resin substrate 10A is provided with a substrate portion 1A. The substrate portion 1A is defined by only one layer of the insulating base material 5A having a flat film shape. The insulating base material 5A is provided with resin 6 and a plurality of conductive particles 7 that are mixed with the resin 6 and is equivalent to the "primary insulating base material". The plurality of conductive particles 7 are dispersed in the resin 6, so that the insulating base material 5A of which the substantial electrical resistivity becomes lower than the specific electrical resistivity of the resin 6 is difficult to be charged.

In addition, the substrate portion 1A is provided with a plurality of conductor patterns 8A. The plurality of conductor patterns 8A are separated from each other, and are provided on the principal surface of each of the insulating base materials 5A. Moreover, the plurality of conductor patterns 8A include a pair of conductor patterns 8A that are adjacent to each other without directly electrically connecting to each other, on the same principal surface of one of the insulating base materials 5A; and a pair of conductor patterns 8A that face each other without directly electrically connecting to each other, between the different principal surfaces of the insulating base materials 5A.

Then, also in the second preferred embodiment, the length L1 at the position A1 at which a distance in the principal surface parallel direction between the pair of conductor patterns 8A that are adjacent to each other on the same principal surface of the insulating base material 5A without directly electrically connecting to each other is smallest is made larger than the length L2 at the position A2 at which a distance in the substrate thickness direction between the pair of conductor patterns 8A that face each other between the different principal surfaces of the insulating base materials 5A without directly electrically connecting to each other is smallest.

Even in the resin substrate 10A with such a configuration, the plurality of conductive particles 7 also have a tendency such that the longitudinal direction is easily oriented along the principal surface parallel direction of the insulating base material 5A. Therefore, the length L1 at the position A1 is made larger than the length L2 at the position A2, so that a short circuit between the conductor patterns 8A that are adjacent to each other in the principal surface parallel direction through the conductive particles 7 is able to be significantly reduced or prevented. Thus, the resin substrate 10A is able to significantly reduce or prevent the occurrence of a failure such as a short circuit between the conductor patterns 8A, and is able to be manufactured with a high manufacturing yield.

Subsequently, a description will be made of a resin substrate 10B according to a third preferred embodiment of the present invention. The third preferred embodiment discloses a case in which a substrate portion is defined by stacking a plurality of insulating base materials only some of which are mixed with conductive particles.

Figure 7:
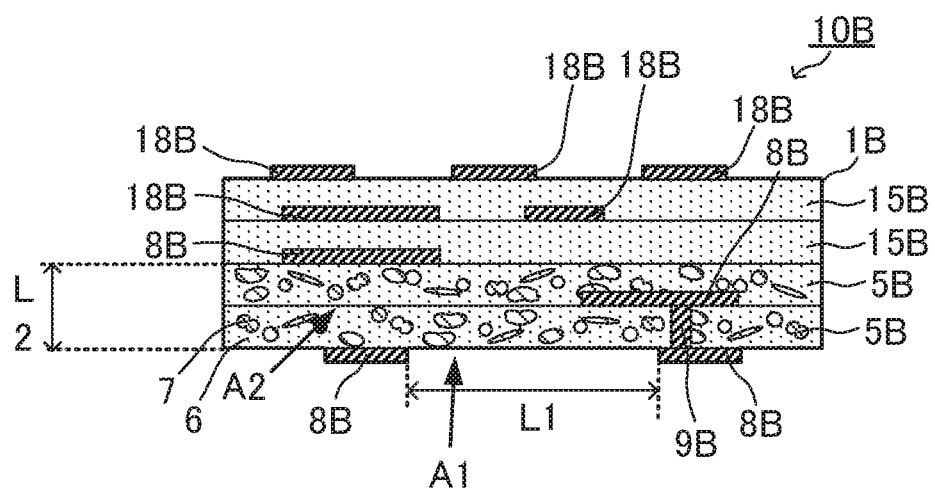
FIG. 7 is a cross-sectional view of a resin substrate according to a third preferred embodiment of the present invention.

FIG. 7 is a schematic cross sectional view of the resin substrate 10B.

The resin substrate 10B is provided with a substrate portion 1B. The substrate portion 1B preferably is configured by stacking two layers of insulating base materials 5B each having a flat film shape and two layers of insulating base materials 15B each having a flat film shape. The insulating base material 5B is provided with resin 6 and a plurality of conductive particles 7 that are mixed with the resin 6 and is equivalent to the "primary insulating base material". The insulating base material 15B is provided with only resin 6. Since the plurality of conductive particles 7 are dispersed in the resin 6, the insulating base material 5B has a substantial electrical resistivity lower than the specific electrical resistivity of the resin 6, that is, the electrical resistivity of the insulating base material 15B. Even with such a configuration, the resin substrate 10B, since having the insulating base material 5B of which the electric resistivity is low, is more difficult to be charged than a resin substrate 10B without the insulating base material 5B.

In addition, the substrate portion 1B is provided with a plurality of conductor patterns 8B and 18B and a via conductor 9B. The plurality of conductor patterns 8B are separated from each other, and are provided along the principal surface of each of the insulating base materials 5B. The plurality of conductor patterns 18B are separated from each other, and are not provided along the principal surface of each of the insulating base materials 5B but are provided only along the principal surface of each of the insulating base materials 15B. Moreover, the plurality of conductor patterns 8B include: a pair of conductor patterns 8B that are adjacent to each other without directly electrically connecting to each other, on the same principal surface of one of the insulating base materials 5B; and a pair of conductor patterns 8B that face each other without directly electrically connecting to each other, between the different principal surfaces of the insulating base materials 5B.

Then, also in the third preferred embodiment, the length L1 at the position A1 at which a distance in the principal surface parallel direction between the pair of conductor patterns 8B that are adjacent to each other on the same principal surface of the insulating base material 5B without directly electrically connecting to each other is smallest is made larger than the length L2 at the position A2 at which a distance in the substrate thickness direction between the pair of conductor patterns 8B that face each other between the different principal surfaces of the insulating base material 5B without directly electrically connecting to each other is smallest.

Even in the resin substrate 10B with such a configuration, the plurality of conductive particles 7 also has a tendency such that the longitudinal direction is easily oriented along the principal surface parallel direction of the insulating base material 5B. Therefore, the length L1 at the position A1 is made larger than the length L2 at the position A2, so that a short circuit between the conductor patterns 8B that are adjacent to each other in the principal surface parallel direction through the conductive particles 7 is able to be significantly reduced or prevented. Thus, the resin substrate 10B is able to significantly reduce or prevent the occurrence of a failure such as a short circuit between the conductor patterns 8B and is also able to be manufactured with a high manufacturing yield.

It is to be noted that, while the plurality of conductor patterns 18B are provided on the insulating base material 15B in which the conductive particles 7 are not mixed, a short circuit by the conductive particles 7 may not occur in the plurality of conductor patterns 18B. Therefore, a distance between such a plurality of conductor patterns 18B that are adjacent to each other may be smaller than the lengths L1 and L2.

Furthermore, in a case in which the plurality of conductor patterns 8B are provided on the insulating base materials 5B in which the conductive particles 7 are mixed, and directly connected to each other through the via conductor 9B, a short circuit by the conductive particles 7 may occur. Therefore, a distance between the conductor patterns 8B that face each other and directly connect each other through the via conductor 9B may be smaller than the lengths L1 and L2.

In addition, in a case in which, in the resin substrate 10B, a coil pattern including a conductor pattern is provided, the conductive particles 7 made of a magnetic particle such as permalloy are used and the coil pattern may be provided on the insulating base material 5B. In such a manner, even if the coil patterns are small in size, a large inductance is able to be obtained.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A resin substrate comprising:
   an insulating base material including a pair of principal surfaces facing each other in a substrate thickness direction of the resin substrate; and
   a plurality of conductor patterns provided on the principal surfaces of the insulating base material; wherein
   the insulating base material includes a primary insulating base material in which a plurality of conductive particles are mixed with resin;
   the plurality of conductor patterns include at least two conductor patterns that are adjacent to each other without directly electrically connecting to each other on a same principal surface of the primary insulating base material;
   the plurality of conductor patterns include at least two conductor patterns that face each other without directly electrically connecting to each other between different principal surfaces of primary insulating base materials;
   a length at a position at which a distance between the two conductor patterns that are adjacent to each other without directly electrically connecting to each other on the same principal surface of the primary insulating base material is smallest is larger than or equal to a length at a position at which a distance between the two conductor patterns that face each other without directly electrically connecting to each other between the different principal surfaces of the primary insulating base materials is smallest;
   the plurality of conductive particles include conductive particles that each have a longitudinal direction of which a diameter is longer than a diameter of the conductive particles in any other direction; and
   a conductive particle among the conductive particles that have the longitudinal direction is located between the two conductor patterns that are adjacent to each other on the same principal surface of the primary insulating base material, and has a length of the diameter in the longitudinal direction that is shorter than the distance between the two conductor patterns that are adjacent to each other on the same principal surface of the primary insulating base material.

2. The resin substrate according to claim 1, wherein the length at the position at which the distance between the two conductor patterns that are adjacent to each other without directly electrically connecting to each other on the same principal surface of the primary insulating base material is smallest is larger than the length at the position at which the distance between the two conductor patterns that face each other without directly electrically connecting to each other between the different principal surfaces of the primary insulating base material is smallest.

3. The resin substrate according to claim 1, wherein the plurality of conductive particles include carbon.

4. The resin substrate according to claim 1, wherein the insulating base material includes a plurality of insulating base materials that are stacked on one another.

5. The resin substrate according to claim 1, wherein the insulating base material includes thermoplastic resin.

6. The resin substrate according to claim 1, further comprising a first electronic component that is incorporated in or surface mounted on the insulating base material.

7. The resin substrate according to claim 1, wherein the insulating base material includes only one layer of insulating base material.

8. The resin substrate according to claim 4, wherein the plurality of insulating base materials includes a secondary insulating base material in which a plurality of conductive particles are not mixed with resin.

9. The resin substrate according to claim 1, further comprising a via conductor that connects at least two of the conductor patterns together, and a distance between the at least two of the conductor patterns connected by the via conductor is less than the length at the position at which the distance between the two conductor patterns that are adjacent to each other without directly electrically connecting to each other on the same principal surface of the primary insulating base material is smallest and the length at the position at which the distance between the two conductor patterns that face each other without directly electrically connecting to each other between the different principal surfaces of the primary insulating base material is smallest.

10. An electronic device comprising:
    the resin substrate according to claim 1;
    a structure that is provided with the resin substrate; and
    a second electronic component that is provided in the structure and electrically connected to the resin substrate.

11. The electronic device according to claim 10, wherein the length at the position at which the distance between the two conductor patterns that are adjacent to each other without directly electrically connecting to each other on the same principal surface of the primary insulating base material is smallest is larger than the length at the position at which the distance between the two conductor patterns that face each other without directly electrically connecting to each other between the different principal surfaces of the primary insulating base material is smallest.

12. The electronic device according to claim 10, wherein the plurality of conductive particles include carbon.

13. The electronic device according to claim 10, wherein the insulating base material includes a plurality of insulating base materials that are stacked on one another.

14. The electronic device according to claim 10, wherein the insulating base material includes thermoplastic resin.

15. The electronic device according to claim 10, further comprising a first electronic component that is incorporated in or surface mounted on the insulating base material.

16. The electronic device according to claim 10, wherein the insulating base material includes only one layer of insulating base material.

17. The electronic device according to claim 13, wherein the plurality of insulating base materials includes a first group of insulating base materials that include the conductive particles and a second group of insulating base materials that do not include the conductive particles.

18. The electronic device according to claim 10, further comprising a via conductor that connects at least two of the conductor patterns together, and a distance between the at least two of the conductor patterns connected by the via conductor is less than the length at the position at which the distance between the two conductor patterns that are adjacent to each other without directly electrically connecting to each other on the same principal surface of the primary insulating base material is smallest and the length at the position at which the distance between the two conductor patterns that face each other without directly electrically connecting to each other between the different principal surfaces of the primary insulating base material is smallest.

* * * * *